United States Patent
Liaghati

(10) Patent No.: US 9,276,599 B2
(45) Date of Patent: Mar. 1, 2016

(54) METHOD AND APPARATUS FOR NON-UNIFORM ANALOG-TO-DIGITAL CONVERSION

(71) Applicant: The Boeing Company, Chicago, IL (US)

(72) Inventor: Amir Leon Liaghati, Huntsville, AL (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/446,107

(22) Filed: Jul. 29, 2014

(65) Prior Publication Data

US 2016/0036456 A1    Feb. 4, 2016

(51) Int. Cl.
*H03M 1/12* (2006.01)

(52) U.S. Cl.
CPC ...................................... *H03M 1/12* (2013.01)

(58) Field of Classification Search
CPC . H03M 1/187; H03M 1/1085; H03M 1/1095; H03M 1/66; H03M 1/12; H03M 1/20; H03M 1/1235; H03M 1/0614; H03M 1/1225; H04L 25/03886; H04L 25/03057
USPC .......... 341/110, 155, 118, 131; 375/243, 232, 375/233
See application file for complete search history.

(56) References Cited

U.S. PATENT DOCUMENTS

| | | | | |
|---|---|---|---|---|
| 4,903,024 A | * | 2/1990 | Evans et al. | 341/120 |
| 5,610,943 A | * | 3/1997 | Kakuishi et al. | 375/243 |
| 6,326,909 B1 | * | 12/2001 | Yamaguchi | 341/120 |
| 6,377,196 B1 | * | 4/2002 | Kolsrud et al. | 341/118 |
| 2004/0177293 A1 | * | 9/2004 | Ricca et al. | 714/724 |
| 2011/0061461 A1 | * | 3/2011 | Yoshida | 73/504.12 |
| 2012/0215405 A1 | * | 8/2012 | Matsuno et al. | 701/36 |
| 2013/0044016 A1 | * | 2/2013 | Matsuno et al. | 341/118 |

OTHER PUBLICATIONS

Jawed, "Analog-to-Digital Converter Design for Non-Uniform Quantization," Linkoping University, Masters Thesis, Dec. 2004, 97 pages.
Kester, "Intentionally Nonlinear DACs," Analog Devices, Inc., MT-018 Tutorial, copyright 2009, 4 pages, accessed Jul. 29, 2014. http://www.analog.com/static/imported-files/tutorials/MT-018.pdf.

* cited by examiner

*Primary Examiner* — Lam T Mai
(74) *Attorney, Agent, or Firm* — Yee & Associates, P.C.

(57) ABSTRACT

A method and apparatus for converting an analog input into a final digital output. A first digital output is generated in response to receiving an analog input at a first converter. A second digital output is generated in response to receiving the analog input at a second converter. The first digital output is output to form the final digital output when an amplitude of the analog input is within a first portion of an overall range of amplitudes for the analog input and the second digital output is output to form the final digital output when the amplitude is within a second portion of the overall range of amplitudes.

20 Claims, 8 Drawing Sheets

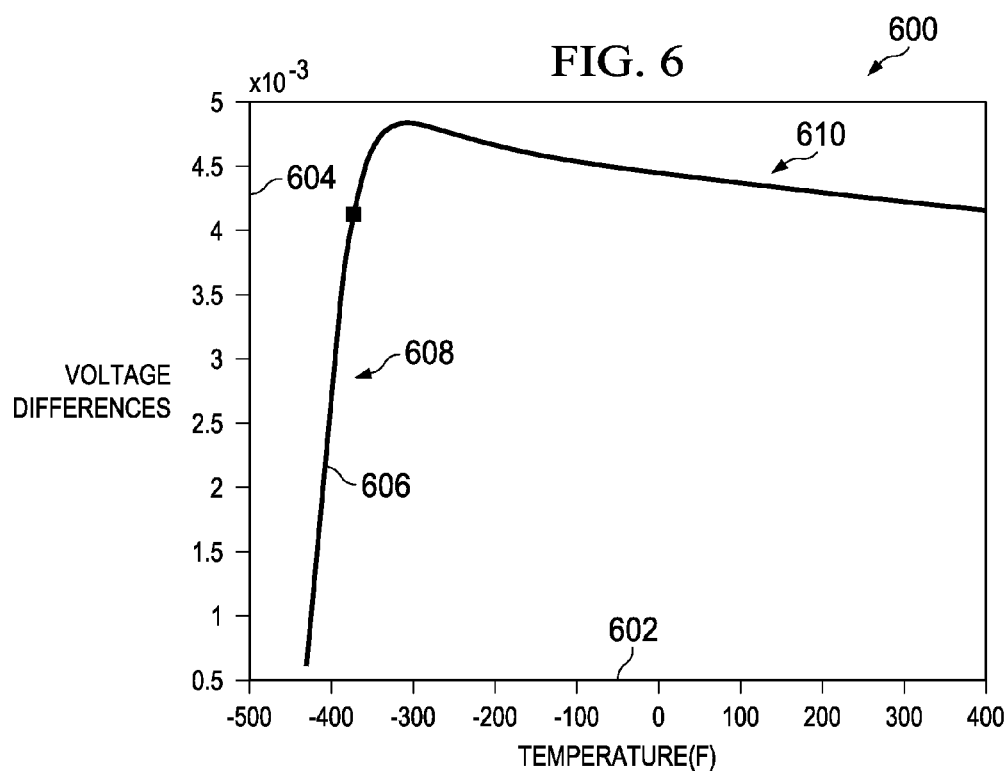
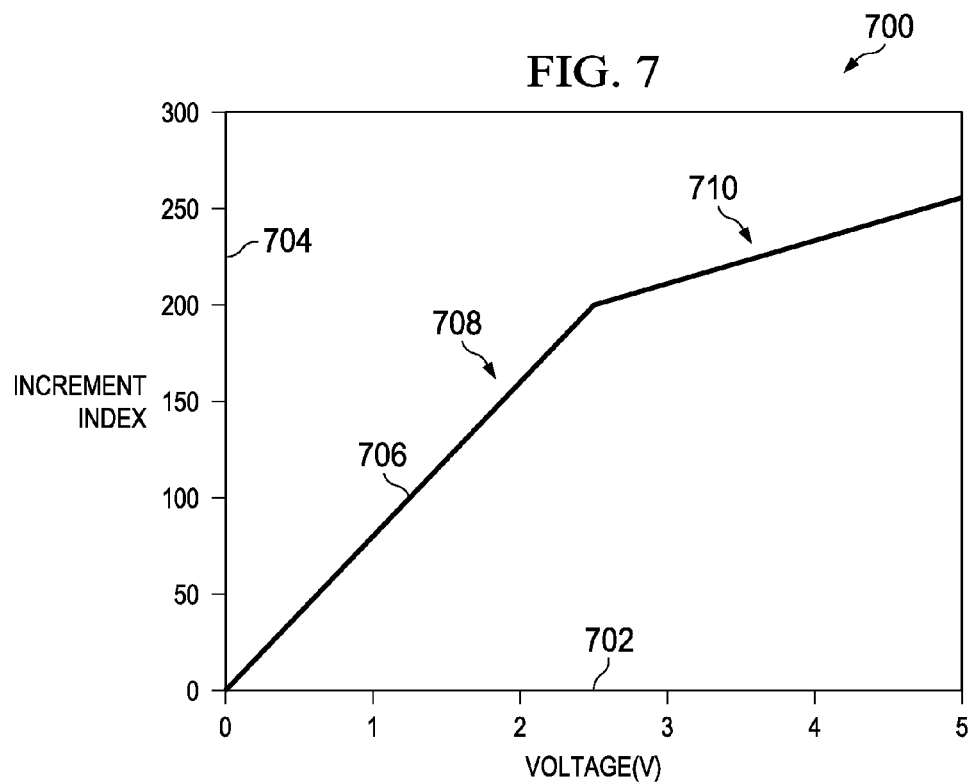

METHOD AND APPARATUS FOR NON-UNIFORM ANALOG-TO-DIGITAL CONVERSION

BACKGROUND INFORMATION

1. Field

The present disclosure relates generally to analog and digital signals and, in particular, to analog-to-digital converters. Still more particularly, the present disclosure relates to a method and apparatus for converting an analog input into a digital output using a conversion device capable of multiple resolutions.

2. Background

An analog-to-digital converter (ADC) is a device that quantizes an analog signal. The analog signal may be a continuous input signal representing a measurable parameter such as voltage or current. Quantization is the process of converting a continuous range of values into a finite range of discrete values. In this manner, quantizing an analog signal means creating a series of discrete digital values that represent the analog signal. These discrete digital values may be represented in, for example, binary format.

The resolution of an analog-to-digital converter is determined by the number of discrete values that can be produced over a range of analog values. In some cases, the resolution of an analog-to-digital converter may be expressed in bits and referred to as bit resolution. An analog-to-digital converter with an N-bit resolution may be able to produce $2^N$ discrete values.

In other cases, the resolution of the analog-to-digital converter may be defined based on the type of measurements received as input. For example, the resolution of an analog-to-digital converter that receives an analog voltage signal as input may be the overall voltage measurement range for the analog-to-digital converter divided by the number of discrete values possible. In particular, the voltage resolution of an analog-to-digital converter may be determined by the least significant bit (LSB) voltage, which is the minimum change in voltage needed to cause a change in the digital output. As the least significant bit voltage decreases, the resolution increases.

In some cases, one portion of a range of measurements may be of more interest than a rest of the range of measurements. For example, a resistance temperature sensor may contain a resistor that changes resistance as a temperature of the resistor changes. As the resistance changes, the voltage signal that is output from the resistance temperature sensor also changes.

However, the change in voltage based on a one degree change in temperature may be smaller at colder temperatures, such as the cryogenic range, as compared to hotter temperatures. Consequently, the discrete values generated by an analog-to-digital converter receiving the voltage signal from the resistance temperature sensor may have a higher degree of error with respect to the colder temperatures as compared to the hotter temperatures.

Some currently available analog-to-digital converters may be unable to improve this error without increasing the bit resolution of the analog-to-digital converter. Increasing the number of bits may increase the amount of digital data that needs to be processed, stored, or both more than desired. Therefore, it would be desirable to have a method and apparatus that take into account at least some of the issues discussed above, as well as other possible issues.

SUMMARY

In one illustrative embodiment, an apparatus comprises a first converter and a second converter. The first converter produces a first digital output in response to receiving an analog input. The second converter produces a second digital output in response to receiving the analog input. The first digital output is output to form a final digital output when an amplitude of the analog input is within a first portion of an overall range of amplitudes for the analog input. The second digital output is output to form the final digital output when the amplitude is within a second portion of the overall range of amplitudes.

In another illustrative embodiment, a conversion device comprises a first converter having a first resolution, a second converter having a second resolution, and a designator. The first converter produces a first digital output in response to receiving an analog input. The second converter produces a second digital output in response to receiving the analog input. The designator designates the first digital output to be output from the conversion device to form a final digital output when an amplitude of the analog input is within a first portion of an overall range of amplitudes for the analog input and designates the second digital output to be output from the conversion device to form the final digital output when the amplitude is within a second portion of the overall range of amplitudes.

In yet another illustrative embodiment, a method is provided for converting an analog input into a final digital output. A first digital output is generated in response to receiving an analog input at a first converter. A second digital output is generated in response to receiving the analog input at a second converter. The first digital output is output to form the final digital output when an amplitude of the analog input is within a first portion of an overall range of amplitudes for the analog input and the second digital output is output to form the final digital output when the amplitude is within a second portion of the overall range of amplitudes.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 6 is an illustration of a graph of temperature versus voltage differences in accordance with an illustrative embodiment;

FIG. 7 is an illustration of a graph of voltage versus increments in accordance with an illustrative embodiment;

DETAILED DESCRIPTION

The illustrative embodiments recognize and take into account different considerations. For example, the illustrative embodiments recognize and take into account that it may be desirable to increase the resolution of an analog-to-digital converter with respect to a particular region of measurements of interest without increasing the number of bits used by the analog-to-digital converter. In particular, the illustrative embodiments recognize and take into account that it may be desirable to have an analog-to-digital converter that may have a plurality of resolutions.

Thus, the illustrative embodiments provide a method and apparatus for converting analog inputs into digital outputs with a plurality of resolutions for a plurality of portions of the overall range of measurements possible. In one illustrative example, a conversion device is provided that includes a plurality of analog-to-digital converts. The conversion device generates a final digital output in response to receiving an analog input. The conversion device has a plurality of resolutions corresponding to a plurality of portions of an overall range of measurements possible for the analog input.

Figure 1:
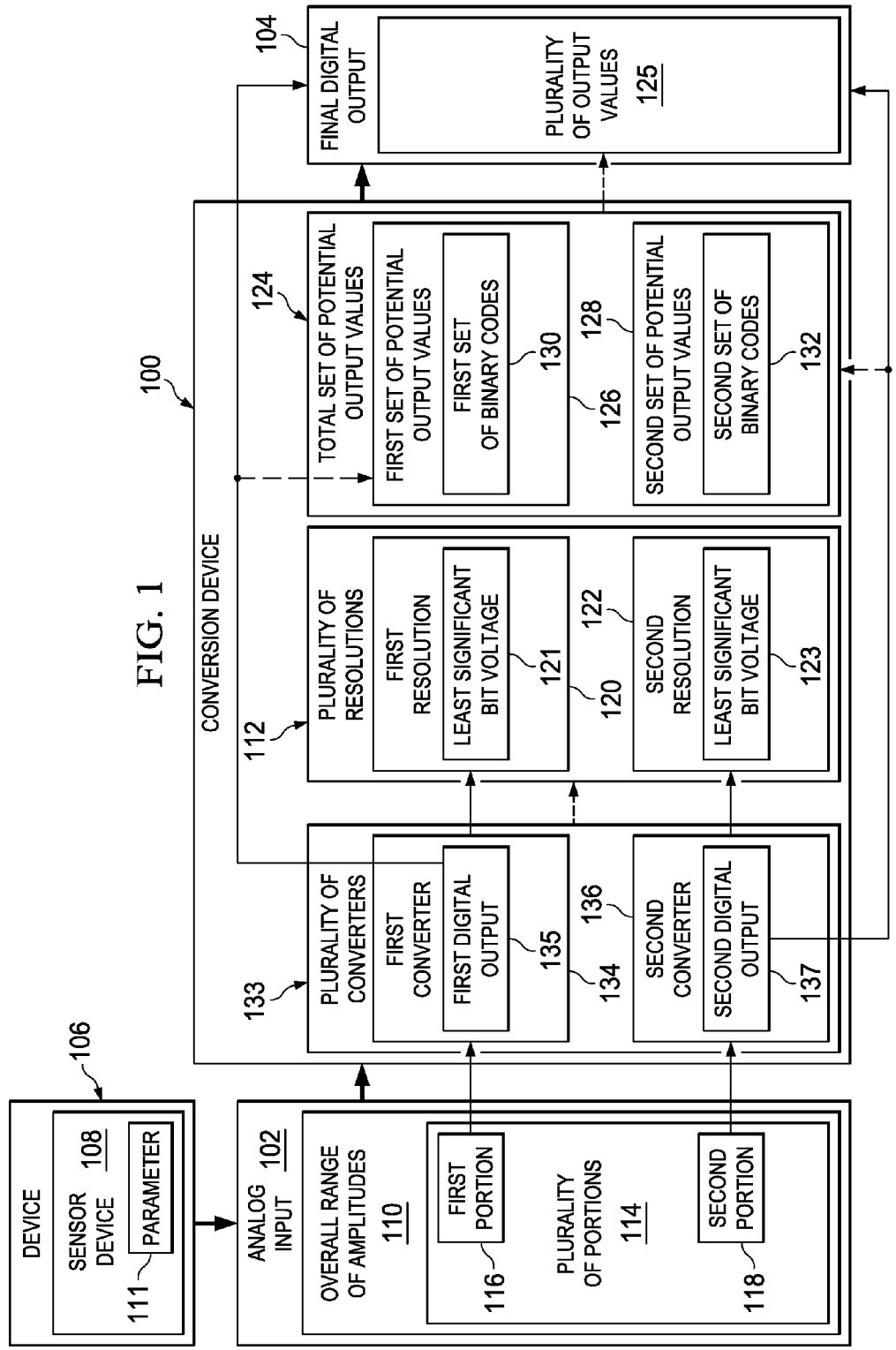
FIG. 1 is an illustration of a conversion device in the form of a block diagram in accordance with an illustrative embodiment.

Referring now to the figures and, in particular, with reference to FIG. 1, an illustration of a conversion device is depicted in the form of a block diagram in accordance with an illustrative embodiment. In this illustrative example, conversion device 100 may be used to convert a continuous input, such as analog input 102, into a discrete output, such as final digital output 104.

Analog input 102 may take the form of, for example, without limitation, a continuous-time and continuous-amplitude analog signal. Final digital output 104 may take the form of, for example, without limitation, a discrete-time and discrete-amplitude digital signal.

In one illustrative example, analog input 102 may be the output of device 106. Device 106 may take the form of, for example, without limitation, sensor device 108. Sensor device 108 may be, for example, without limitation, a temperature sensor, a resistance temperature sensor, a pressure sensor, a laser sensor, an ultrasonic sensor, or some other type of sensor. In other illustrative examples, device 106 may take some other form.

Analog input 102 may be any continuous signal for which the time varying variable of the signal is a representation of some other time varying quantity. In this illustrative example, analog input 102 may be comprised of continuous input values over a time continuum for parameter 111. Parameter 111 may be, for example, without limitation, a measurable parameter such as voltage, current, or some other measurable parameter.

For example, when analog input 102 is an analog audio signal, parameter 111 may be a pressure of sound waves. The instantaneous amplitude of the analog audio signal, which may be an instantaneous voltage, may vary continuously in correspondence with a varying of the pressure of the sound waves. When analog input 102 is an analog temperature signal from a resistance temperature sensor, parameter 111 may be considered resistance of a resistor or a temperature of the resistor. The instantaneous amplitude of the analog temperature signal, which may be an instantaneous voltage, may vary continuously in correspondence with a varying of the resistance of the resistor based on the temperature of the resistor.

Analog input 102 may have overall range of amplitudes 110 for parameter 111. For example, without limitation, at any point in time, analog input 102 may have an amplitude within overall range of amplitudes 110. In some cases, this amplitude may also be referred to as an amplitude, a measurement value, a measurement, an input value, an analog value, or some other type of value of analog input 102. For example, overall range of amplitudes 110 for analog input 102 may be an overall range of measurements for analog input 102.

As one illustrative example, overall range of amplitudes 110 for analog input 102 may be between about −5 volts and about 5 volts. In another example, overall range of amplitudes 110 for analog input 102 may be between about 0 volts and about 5 volts. In yet another illustrative example, overall range of amplitudes 110 for analog input 102 may be between about −10 volts and about 10 volts.

Conversion device 100 may have plurality of resolutions 112 corresponding to plurality of portions 114 of overall range of amplitudes 110. Plurality of portions 114 may include, but is not limited to, first portion 116 and second portion 118.

Conversion device 100 may have first resolution 120 corresponding to first portion 116 and second resolution 122 corresponding to second portion 118. First resolution 120 and second resolution 122 may be based on least significant bit voltage 121 and least significant bit voltage 123, respectively.

In one illustrative example, first portion 116 may be a region of overall range of amplitudes 110 that is of interest. Consequently, first resolution 120 may be set higher than second resolution 122. In other words, least significant bit voltage 121 for conversion device 100 with respect to first portion 116 may be smaller than least significant bit voltage 123 for conversion device 100 with respect to second portion 118.

As one illustrative example, when overall range of amplitudes 110 for analog input 102 is between about 0 volts and about 5 volts, first portion 116 may be between about 0 volts and about 2.5 volts, while second portion 118 may be between about 2.5 volts and about 5 volts. Least significant bit voltage 121 of conversion device 100 with respect to first portion 116 may be set to, for example, without limitation, about 0.0126 volts. Least significant bit voltage 123 of conversion device 100 with respect to second portion 118 may be set to, for example, without limitation, about 0.0446 volts. In this manner, first resolution 120 may be higher than second resolution 122.

In one illustrative example, final digital output 104 may be comprised of plurality of output values 125, which may also be referred to as a sequence of output values. Each output value in plurality of output values 125 that is output from conversion device 100 may be selected from one of total set of potential output values 124.

Total set of potential output values 124 may be a discrete set of output values that represent overall range of amplitudes 110. Total set of potential output values 124 may be divided up into first set of potential output values 126 and second set of potential output values 128. First set of potential output values 126 may be assigned to first portion 116 of overall range of amplitudes 110. Second set of potential output values 128 may be assigned to second portion 118 of overall range of amplitudes 110. In this manner, first set of potential output values 126 may provide first resolution 120 and second set of potential output values 128 may provide second resolution 122.

For example, without limitation, total set of potential output values 124 may be a total set of binary codes. First set of potential output values 126 and second set of potential output values 128 may be first set of binary codes 130 and second set of binary codes 132, respectively. The number of binary codes in the total set of binary codes may be determined by the particular implementation of conversion device 100.

As one illustrative example, conversion device 100 may include plurality of converters 133 that provide plurality of resolutions 112. Plurality of converters 133 may include first converter 134 and second converter 136. Each of first converter 134 and second converter 136 may take the form of an N-bit analog-to-digital converter. For example, without limitation, first converter 134 and second converter 136 may be 8-bit analog-to-digital converters, 12-bit analog-to-digital converters, 16-bit analog-to-digital converters, or some other type of N-bit analog-to-digital converters.

Further, first converter 134 and second converter 136 may be linear analog-to-digital converters. In other words, each of first converter 134 and second converter 136 may be configured to linearly, or uniformly, quantize a continuous input, such as analog input 102. In some cases, first converter 134 and second converter 136 may be referred to as uniform analog-to-digital converters.

First converter 134 may be used to generate first digital output 135. Second converter 136 may be used to generate second digital output 137. Each of first digital output 135 and second digital output 137 may be comprised of a number of output values. First digital output 135, second digital output 137, or both may be used to form final digital output 104. Thus, in some cases, final digital output 104 may be formed by a combination of output values from first digital output 135 and second digital output 137.

First converter 134 may be configured to provide first resolution 120 corresponding to first portion 116 of overall range of amplitudes 110. Based on first resolution 120 desired for first portion 116, a portion of total set of potential output values 124 may be designated to form first set of potential output values 126. In this manner, first set of potential output values 126 may be assigned to both first portion 116 and first converter 134.

When first converter 134 receives analog input 102 having an amplitude value within first portion 116 of overall range of amplitudes 110, first converter 134 generates a corresponding output value from first set of potential output values 126 to form first digital output 135. First converter 134 may be configured to produce an output for other amplitude values outside of first portion 116 of overall range of amplitudes 110.

However, conversion device 100 is configured such that an output value generated by first converter 134 in response to receiving analog input 102 is only used to form one of plurality of output values 125 when the corresponding amplitude value of analog input 102 is within first portion 116. In other words, conversion device 100 is configured such that an output value generated by first converter 134 in response to receiving analog input 102 is only used to form final digital output 104 when the output value is one of first set of potential output values 126 assigned to first portion 116.

In a similar manner, second converter 136 may be configured to provide second resolution 122 corresponding to second portion 118 of overall range of amplitudes 110. Based on second resolution 122 desired for second portion 118, a portion of total set of potential output values 124 may be designated to form second set of potential output values 128. In this manner, second set of potential output values 128 may be assigned to both second portion 118 and second converter 136.

When second converter 136 receives analog input 102 having an amplitude value within second portion 118 of overall range of amplitudes 110, second converter 136 generates a corresponding output value from second set of potential output values 128 to form second digital output 137. Second converter 136 may be configured to produce an output for other amplitude values outside of second portion 118 of overall range of amplitudes 110. However, conversion device 100 is configured such that an output value generated by second converter 136 in response to receiving analog input 102 is only used to form one of plurality of output values 125 when the corresponding amplitude value of analog input 102 is within second portion 118. In other words, conversion device 100 is configured such that an output value generated by second converter 136 in response to receiving analog input 102 is only used to form final digital output 104 when the output value is one of second set of potential output values 128 assigned to second portion 118.

In one illustrative example, first converter 134 and second converter 136 may be 8-bit analog-to-digital converters. Total set of potential output values 124 may be 256 binary codes.

The first 200 binary codes of the 256 binary codes may be designated to form first set of binary codes 130. These 200 binary codes may be assigned to first portion 116 of overall range of amplitudes 110 and to first converter 134. First converter 134 may be configured to produce up to 256 binary codes, but only the designated 200 of those binary codes may be used to form final digital output 104.

The last 56 binary codes of the 256 binary codes may be designated to form second set of binary codes 132. These 56 binary codes may be assigned to second portion 118 of overall range of amplitudes 110 and to second converter 136. Second converter 136 may be configured to produce up to 256 binary codes, but only the designated 56 of those binary codes may be used to form final digital output 104. The 200 binary codes assigned to first converter 134 and the 56 binary codes assigned to second converter 136 may each be unique and distinct. Thus, the 200 binary codes assigned to first converter 134 and the 56 binary codes assigned to second converter 136 may form the total 256 binary codes in total set of potential output values 124.

When first portion 116 is between about 0 volts and about 2.5 volts, first set of binary codes 130 having 200 binary codes may result in least significant bit voltage 121 being about 0.0125 volts. Further, when second portion 118 is between about 2.5 volts and about 5 volts, second set of binary codes 132 having 56 binary codes may result in least significant bit voltage 121 being about 0.0446 volts. In this manner, a higher resolution may be provided for first portion 116 as compared to second portion 118.

By providing increased resolution corresponding to first portion 116 relative to second portion 118 of overall range of amplitudes 110, conversion device 100 may generate final digital output 104 non-uniformly, or nonlinearly. In this manner, conversion device 100 may be referred to as a non-uniform conversion device or a nonlinear conversion device. Conversion device 100 provides non-uniform analog-to-digital conversion.

Conversion device 100 may be adapted to handle analog inputs having different overall ranges of amplitudes. Further, the quantization of analog input 102 by conversion device 100 may not be fixed. Conversion device 100 may be adjusted to provide different types of quantizations. For example, conversion device 100 may be adapted to provide different resolutions for different portions of overall range of amplitudes 110. In one illustrative example, conversion device 100 may provide increased resolution for second portion 118 as compared to first portion 116 of overall range of amplitudes 110.

Conversion device 100 may be implemented in a number of different ways. Examples of different implementations for conversion device 100 are described in FIGS. 2-4 below.

The illustration of conversion device 100 in FIG. 1 is not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

For example, in other cases, plurality of converters 133 in conversion device 100 may include a third converter having a third resolution and configured to generate a third digital output. The third digital output may be used to form final digital output 104 when analog input 102 has an amplitude within a third portion of overall range of amplitudes 110. In this manner, conversion device 100 may include a plurality of converters having plurality of resolutions 112 corresponding to plurality of portions 114 of overall range of amplitudes 110. In particular, each of the plurality of converters may have a corresponding resolution in plurality of resolutions 112 that corresponds to a corresponding portion in plurality of portions 114 of overall range of amplitudes 110.

Figure 2:
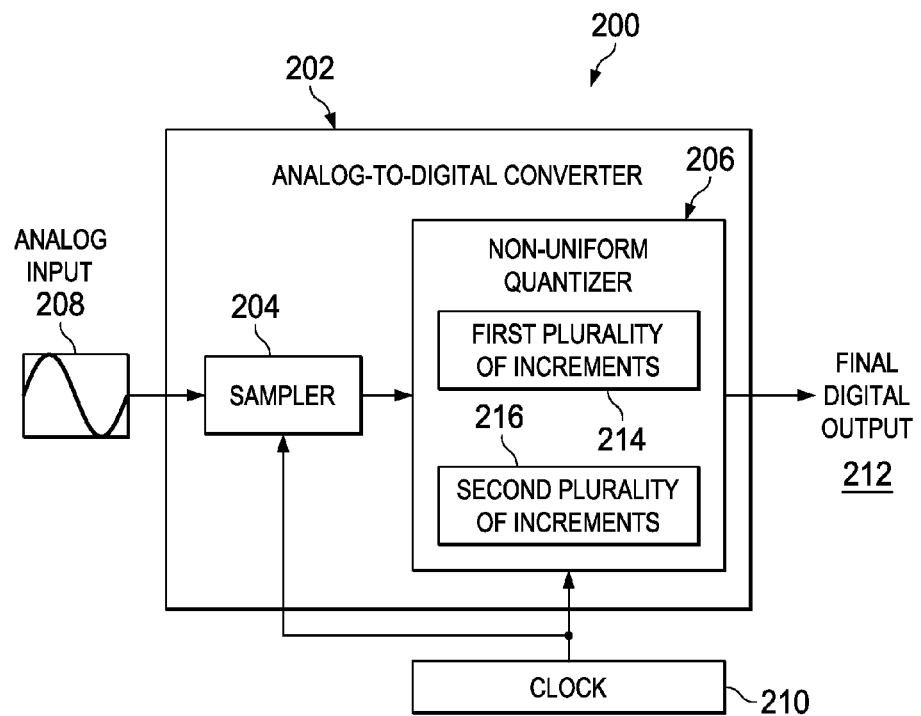
FIG. 2 is an illustration of a schematic diagram of a conversion device in accordance with an illustrative embodiment.

With reference now to FIG. 2, an illustration of a schematic diagram of a conversion device is depicted in accordance with an illustrative embodiment. In this illustrative example, conversion device 200 is an example of one implementation for conversion device 100 in FIG. 1. Conversion device 200 takes the form of analog-to-digital converter 202 in this example.

As depicted, conversion device 200 includes sampler 204 and non-uniform quantizer 206. Sampler 204 receives analog input 208. Analog input 208 may be, for example, without limitation, a signal from a sensor device. Sampler 204 samples analog input 208 at a sampling rate based on clock 210. In this illustrative example, clock 210 is external to conversion device 200. However, in other examples, clock 210 may be internal to conversion device 200.

Sampler 204 sends samples of analog input 208 to non-uniform quantizer 206. Non-uniform quantizer 206 may convert each of the samples received into a digital value in binary format to form final digital output 212. Non-uniform quantizer 206 may be an N-bit system that can produce $2^N$ discrete values. Each of the $2^N$ discrete values may be encoded using a unique binary code comprised of the N bits.

Non-uniform quantizer 206 may divide the overall range of amplitudes possible for analog input 208 into $2^N-1$ increments of amplitude values. The amplitude values may be, for example, without limitation, voltage values. Thus, the increments may be increments in volts.

In this illustrative example, non-uniform quantizer 206 may assign a first portion of the increments, which may be first plurality of increments 214, to a first portion of the overall range of amplitudes and a second portion of the increments, which may be second plurality of increments 216, to a second portion of the overall range of amplitude. The increments may be assigned such that a resolution corresponding to the first portion of the overall range of amplitudes is higher than a resolution corresponding to the second portion of the overall range of amplitude.

Each increment in first plurality of increments 214 may be calculated using the following:

$$i_1 = \frac{A1_{max} - A1_{min}}{2^N - 1} \qquad (1)$$

where $i_1$ is each increment in first plurality of increments 214, $A1_{max}$ is the maximum amplitude value in the first portion of the overall range of amplitudes, and $A1_{min}$ is the minimum amplitude value in the first portion overall range of amplitudes.

Each increment in second plurality of increments 216 may be calculated using the following:

$$i_2 = \frac{A2_{max} - A2_{min}}{2^N - 1} \qquad (2)$$

where $i_2$ is each increment in second plurality of increments 216, $A2_{max}$ is the maximum amplitude value in the second portion of the overall range of amplitudes, and $A2_{min}$ is the minimum amplitude value in the second portion overall range of amplitudes.

In one illustrative example, the overall range of amplitudes possible for analog input 208 may be, but is not limited to, a range of voltages between about 0 volts and about 5 volts. The first portion of this range of voltages may be designated as, for example, between about 0 volts and about 1.25 volts. The second portion of this range of voltages may be designated as, for example, between about 1.25 volts and about 5 volts.

Non-uniform quantizer 206 may be, for example, but is not limited to, a 12-bit system. Consequently, non-uniform quantizer 206 may be able to produce $2^{12}$ discrete values, which includes 4,096 discrete values. Non-uniform quantizer 206 may divide the overall range of amplitudes possible for analog input 208 into 4,095 increments. About 2,000 increments of these 4,095 increments may be designated as first plurality of increments 214 and assigned to the first portion of the range of voltages. The other 2,095 increments of the 4,095 increments may be designated as second plurality of increments 216 and assigned to the second portion of the range of voltages.

In this manner, non-uniform quantizer 206 may non-uniformly quantize analog input 208. Non-uniform quantizer 206 may non-uniformly quantize analog input 208 such that a higher resolution corresponds to the first portion of the range of voltages.

In other illustrative examples, the overall range of amplitudes for analog input 208 may be some other range. Further, in other illustrative examples, the number of bits used by non-uniform quantizer 206 to quantize analog input 208 may be 8 bits, 16 bits, or some other number of bits.

Figure 3:
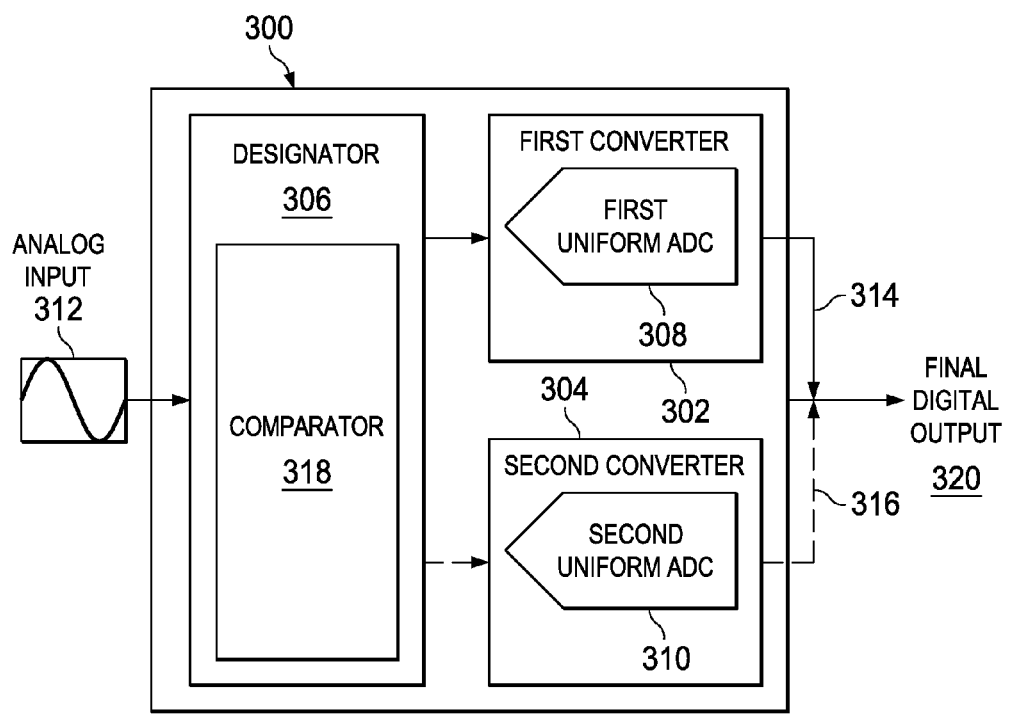
FIG. 3 is an illustration of a schematic diagram of a conversion device in accordance with an illustrative embodiment.

With reference now to FIG. 3, an illustration of a schematic diagram of a conversion device is depicted in accordance with an illustrative embodiment. In this illustrative example, conversion device 300 may be an example of one implementation for conversion device 100 in FIG. 1.

As depicted, conversion device 300 may include first converter 302, second converter 304, and designator 306. In this illustrative example, first converter 302 and second converter 304 may be implemented as first uniform analog-to-digital converter (ADC) 308 and second uniform analog-to-digital converter (ADC) 310, respectively.

First uniform analog-to-digital converter 308 may uniformly quantize analog input 312 to form first digital output 314. Second uniform analog-to-digital converter 310 may uniformly quantize analog input 312 to form second digital output 316. First uniform analog-to-digital converter 308 and second uniform analog-to-digital converter 310 may be N-bit uniform analog-to-digital converters.

Designator 306 may be configured to receive analog input 312. As designator 306 receives analog input 312, designator 306 determines whether analog input 312 is to be sent to first uniform analog-to-digital converter 308 or to second uniform analog-to-digital converter 310.

In one illustrative example, designator 306 sends analog input 312 to first uniform analog-to-digital converter 308 when analog input 312 has amplitude values that are within a first portion of an overall range of amplitudes for analog input 312. Further, designator 306 sends analog input 312 to second uniform analog-to-digital converter 310 when analog input 312 has amplitude values that are within a second portion of an overall range of amplitudes for analog input 312.

In this illustrative example, first uniform analog-to-digital converter 308 may have a higher resolution than second uniform analog-to-digital converter 310. For example, when the amplitude values for analog input 312 are voltage values, first uniform analog-to-digital converter 308 may have a smaller least significant bit voltage than second uniform analog-to-digital converter 310.

In one illustrative example, designator 306 takes the form of comparator 318. As analog input 312 is received by comparator 318, comparator 318 may compare the amplitude values of analog input 312 to a threshold amplitude that divides the overall range of amplitudes for analog input 312 into the first portion and the second portion.

For example, without limitation, if the amplitude value of analog input 312 is less than the selected threshold, comparator 318 sends analog input 312 to first uniform analog-to-digital converter 308. If the amplitude value of analog input 312 is equal to or greater than the selected threshold, comparator 318 sends analog input 312 to second uniform analog-to-digital converter 310.

In this manner, final digital output 320 may be formed using first digital output 314, second digital output 316, or both. The output value in final digital output 320 generated by conversion device 300 that corresponds to a particular sample of analog input 312 may be generated by either first uniform analog-to-digital converter 308 or second uniform analog-to-digital converter 310.

Figure 4:
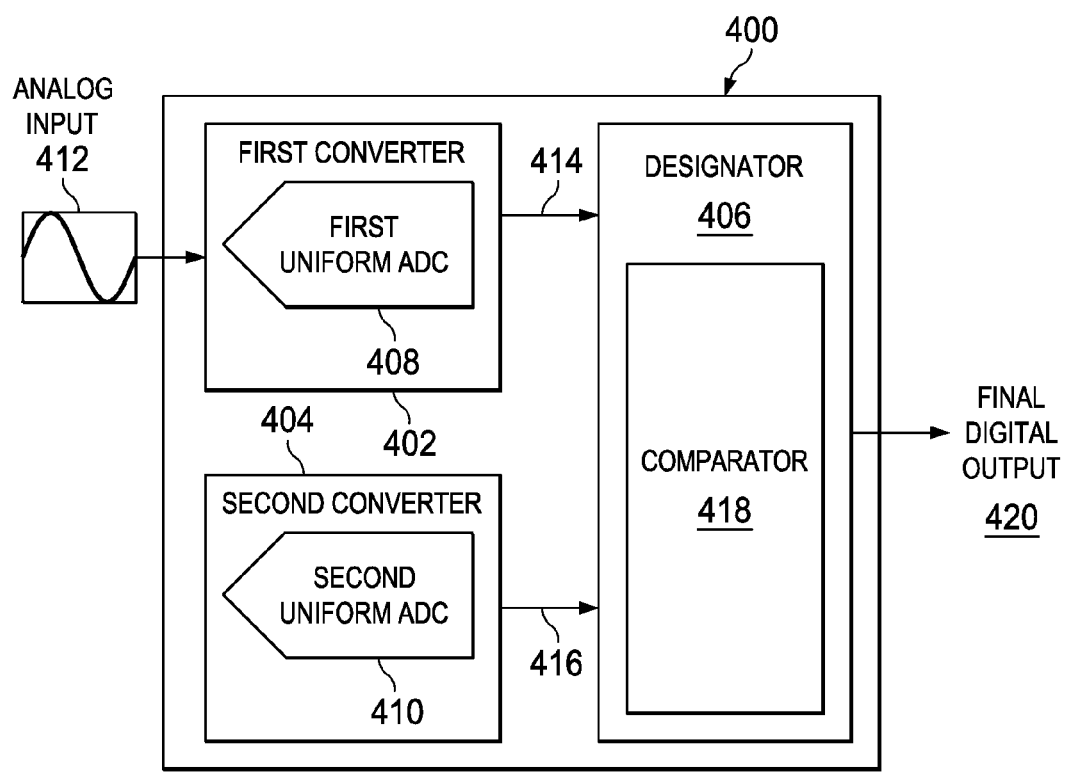
FIG. 4 is an illustration of a different configuration for a conversion device in accordance with an illustrative embodiment.

With reference now to FIG. 4, an illustration of a different configuration for a conversion device is depicted in accordance with an illustrative embodiment. In this illustrative example, conversion device 400 may have a different configuration than conversion device 300 in FIG. 3. Conversion device 400 may be another example of one implementation for conversion device 100 in FIG. 1.

As depicted, conversion device 400 may include first converter 402, second converter 404, and designator 406. In this illustrative example, first converter 402 and second converter 404 may be implemented as first uniform analog-to-digital converter (ADC) 408 and second uniform analog-to-digital converter (ADC) 410, respectively. First uniform analog-to-digital converter 408 and second uniform analog-to-digital converter 410 may be N-bit uniform analog-to-digital converters.

As depicted, both first uniform analog-to-digital converter 408 and second uniform analog-to-digital converter 410 may receive analog input 412. Both first uniform analog-to-digital converter 408 and second uniform analog-to-digital converter 410 may uniformly quantize analog input 412 to form first digital output 414 and second digital output 416. Designator 406 may determine whether first digital output 414 or second digital output 416 is to be output from conversion device 400 as final digital output 420.

In one illustrative example, for every sample of analog input 412, first uniform analog-to-digital converter 408 and second uniform analog-to-digital converter 410 may generate a pair of corresponding output values. These output values, may be, for example, without limitation, binary codes. Designator 406 may take the form of comparator 418 that compares at least one of these output values to a reference output value.

For example, comparator 418 may perform a comparison of a first output value in first digital output 414 generated by first uniform analog-to-digital converter 408 to a reference output value, which may be a reference binary code. Comparator 418 may output one of the first output value in first digital output 414 and a second output value in second digital output 416 generated by second uniform analog-to-digital converter 410 to form final digital output 420 based on the comparison.

In particular, if the first output value in first digital output 414 from first uniform analog-to-digital converter 408 is less than the reference output value, comparator 418 may send this first output value out from conversion device 400 to form final digital output 420. However, if the first output value in first digital output 414 from first uniform analog-to-digital converter 408 is equal to or greater than the reference output value, comparator 418 may instead send the corresponding second output value in second digital output 416 generated by second uniform analog-to-digital converter 410 out from conversion device 400 to form final digital output 420.

Figure 5:
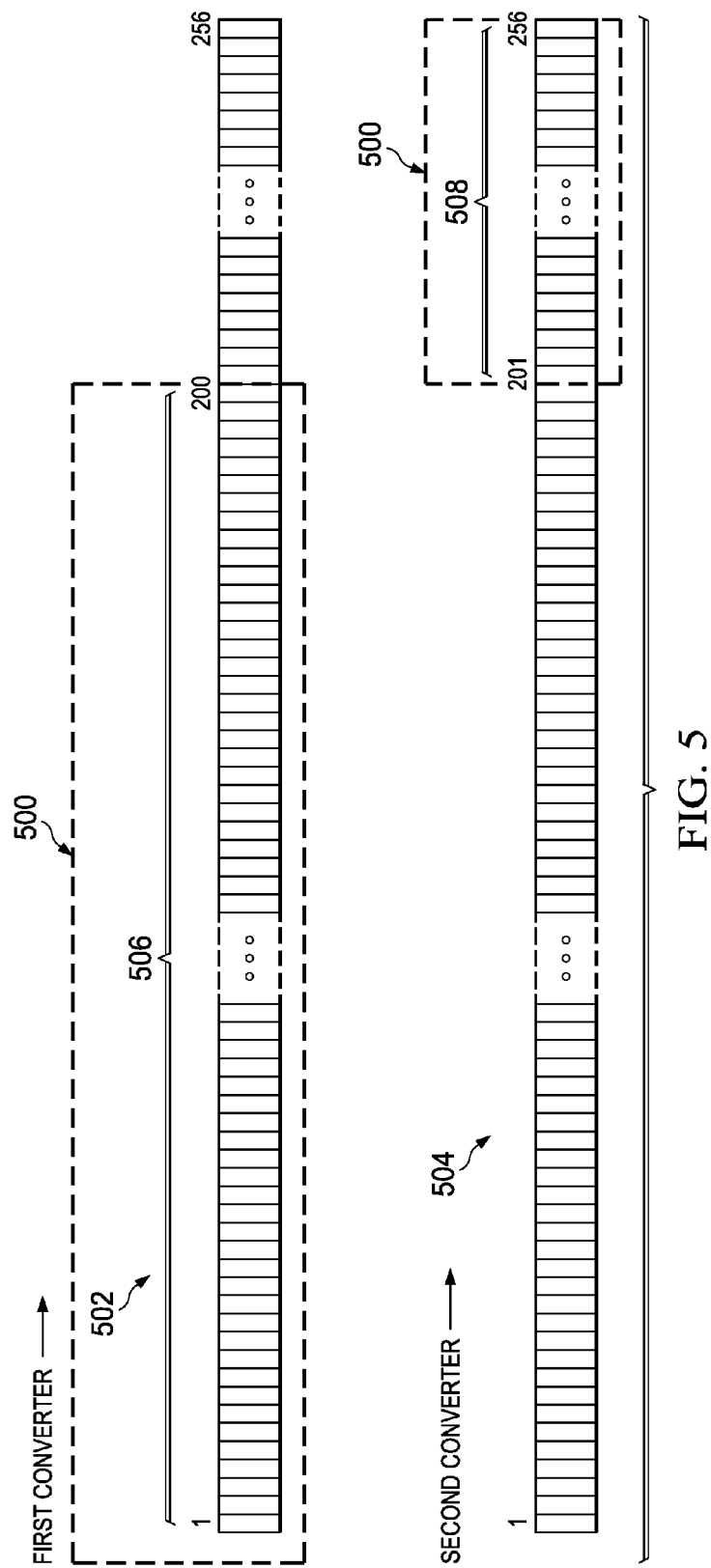
FIG. 5 is an illustration of a total set of potential binary codes in accordance with an illustrative embodiment.

With reference now to FIG. 5, an illustration of a total set of potential binary codes is depicted in accordance with an illustrative embodiment. In this illustrative example, total set of potential binary codes 500 may be an example of one implementation for total set of potential output values 124 in FIG. 5.

As depicted, a first converter, such as first uniform analog-to-digital converter 308 in FIG. 3 and first uniform analog-to-digital converter 408 in FIG. 4, may be configured to output any one of potential binary codes 502. In this illustrative example, the first converter may be an 8-bit device capable of outputting 256 binary codes. Further, a second converter, such as second uniform analog-to-digital converter 310 in FIG. 3 and second uniform analog-to-digital converter 410 in FIG. 4, may be configured to output any one of potential binary codes 504. In this illustrative example, the second converter may be an 8-bit device capable of outputting 256 binary codes.

However, only a portion of potential binary codes 502 and a portion of potential binary codes 504 may be used to form total set of potential binary codes 500. Potential binary codes 502 may be exactly the same as potential binary codes 504. But potential binary codes 502 may represent different amplitude values than potential binary codes 504.

For example, potential binary codes 502 may represent the amplitude values within a first portion of an overall range of amplitudes for an analog input, as well as other amplitudes. First set of binary codes 506 in potential binary codes 502 may represent the amplitude values of this first portion of the overall range of amplitudes. First set of binary codes 506 includes the first 200 binary codes of potential binary codes 502.

Potential binary codes 504 may represent the amplitude values within a second portion of the overall range of amplitudes for the analog input, as well as other amplitudes. Second set of binary codes 508 in potential binary codes 504 may represent the amplitude values of this second portion of the overall range of amplitudes. Second set of binary codes 508 includes the last 56 binary codes of potential binary codes 504.

First set of binary codes 506 and second set of binary codes 508 together form the final 256 binary codes in total set of potential binary codes 500. First set of binary codes 506 may be distinct from second set of binary codes 508 such that each of total set of potential binary codes 500 is unique and represents a distinct amplitude value.

First set of binary codes 506 may be used to uniformly quantize a first portion of an overall range of amplitudes for an analog input. Second set of binary codes 506 may be used to uniformly quantize a second portion of an overall range of amplitudes for the analog input. The second portion does not overlap with the first portion. Together, first set of binary codes 506 and second set of binary codes 508 may be used to non-uniformly and substantially completely quantize the overall range of amplitudes for the analog input.

The illustrations of conversion device 200 in FIG. 2, the different configurations for conversion device 300 in FIG. 3 and conversion device 400 in FIG. 4, and total set of potential binary codes 500 in FIG. 5 are not meant to imply physical or architectural limitations to the manner in which an illustrative embodiment may be implemented. Other components in addition to or in place of the ones illustrated may be used. Some components may be optional.

The different components shown in FIGS. 2-5 may be illustrative examples of how components shown in block form in FIG. 1 can be implemented as physical structures. Additionally, some of the components in FIGS. 2-5 may be combined with components in FIG. 1, used with components in FIG. 1, or a combination of the two.

With reference now to FIG. 6, an illustration of a graph of temperature versus voltage differences is depicted in accordance with an illustrative embodiment. In this illustrative example, graph 600 may include horizontal axis 602 and vertical axis 604.

Horizontal axis 602 represents the temperature detected by a resistance temperature sensor. Vertical axis 604 represents the change in voltage of an analog signal that is output by the resistance temperature sensor in response to the temperature changes. Line 606 identifies the differences in voltage per incremental increase of about one degree Fahrenheit.

As indicated by portion 608 of line 606 and portion 610 of line 606, the change in voltage is greater at the lower range of temperatures than at the higher range of temperatures. Thus, a higher resolution may be desirable to quantize the portion of the analog signal output by the resistance temperature sensor corresponding to the lower range of temperatures as compared to the higher range of temperatures.

Turning now to FIG. 7, an illustration of a graph of voltage versus increments is depicted in accordance with an illustrative embodiment. In this illustrative example, graph 700 may include horizontal axis 702 and vertical axis 704.

Horizontal axis 702 represents voltage of an analog signal. In one illustrative example, the analog signal is output by a resistance temperature sensor. Vertical axis 704 represents the index of increments for a non-uniform quantizer. Line 706 identifies the indices of the increments corresponding to the different voltages per step change in voltage.

As indicated by portion 708 of line 706 and portion 710 of line 706, a greater number of increments are assigned to the lower half of the overall range of voltages as compared to the upper half of the overall range of voltages. In this manner, the non-uniform quantizer may have a higher resolution corresponding to the lower half of the overall range of voltages as compared to the upper half of the overall range of voltages.

Figure 8:
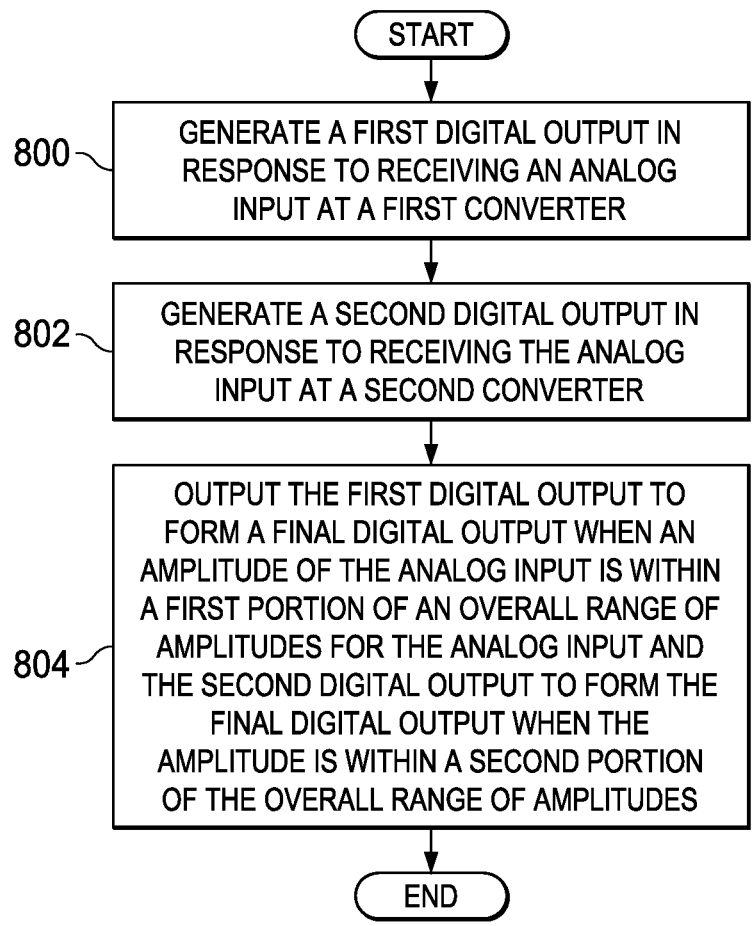
FIG. 8 is an illustration of a process for converting an analog input into a final digital output in the form of a flowchart in accordance with an illustrative embodiment.

With reference now to FIG. 8, an illustration of a process for converting an analog input into a final digital output is depicted in the form of a flowchart in accordance with an illustrative embodiment. The process illustrated in FIG. 8 may be implemented using, for example, without limitation, conversion device 100 in FIG. 1, conversion device 200 in FIG. 2, conversion device 300 in FIG. 3, or conversion device 400 in FIG. 4.

The process begins by generating a first digital output in response to receiving an analog input at a first converter (operation 800). A second digital output is generated in response to receiving the analog input at a second converter (operation 802).

The first digital output is output to form a final digital output when an amplitude of the analog input is within a first portion of an overall range of amplitudes for the analog input and the second digital output is output to form the final digital output when the amplitude is within a second portion of the overall range of amplitudes (operation 804), with the process terminating thereafter. In operation 804, whether the first digital output or the second digital output is output may be controlled using a designator. For example, a designator, such as designator 306 in FIG. 3, may be used to determine when the input values in the analog input are sent to the first converter such that operation 800 is performed and when the input values in the analog input are sent to the second converter such that operation 802 is performed.

In other examples, operation 800 and operation 802 may be performed for the same input values. A designator, such as designator 406 in FIG. 4, may be used to determine whether the first digital output generated in operation 800 or the second digital output generated in operation 802 is output in operation 804.

Figure 9:
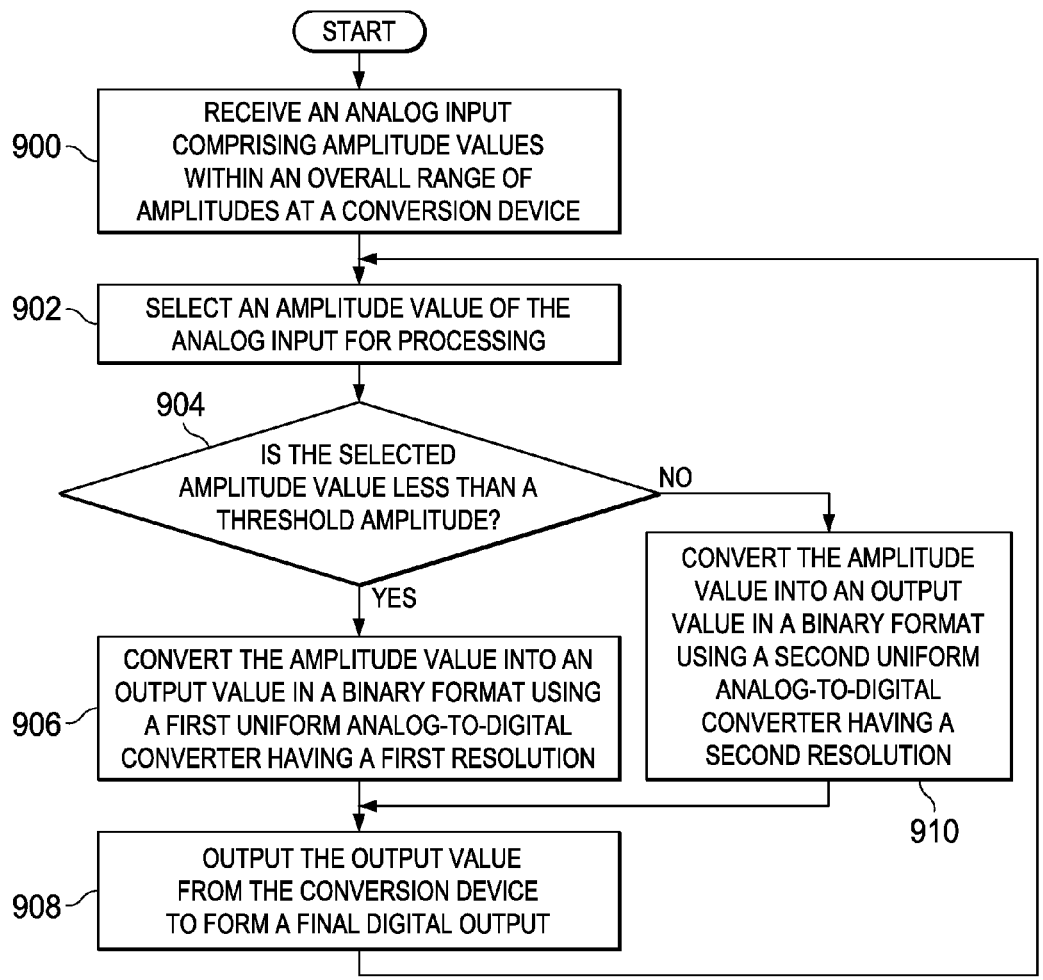
FIG. 9 is an illustration of a process for converting an analog input into a final digital output in the form of a flowchart in accordance with an illustrative embodiment.

With reference now to FIG. 9, an illustration of a process for converting an analog input into a final digital output is depicted in the form of a flowchart in accordance with an illustrative embodiment. The process illustrated in FIG. 9 may be implemented using, for example, without limitation, conversion device 100 in FIG. 1.

The process begins by receiving an analog input comprising amplitude values within an overall range of amplitudes at a conversion device (operation 900). An amplitude value of the analog input is selected for processing (operation 902). In some cases, this amplitude value may be of a sample of the analog input at a particular point in time. A determination is made as to whether the selected amplitude value is less than a threshold amplitude (operation 904).

If the selected amplitude value is less than the threshold amplitude, the amplitude value is converted into an output value in a binary format using a first uniform analog-to-digital converter having a first resolution (operation 906). The output value is output from the conversion device to form a final digital output (operation 908), with the process then returning to operation 902 described above. With reference again to operation 904, if the selected amplitude value is not less than the selected threshold, the amplitude value is converted into an output value in a binary format using a second uniform analog-to-digital converter having a second resolution (operation 910), with the process then proceeding to operation 908 described above.

Figure 10:
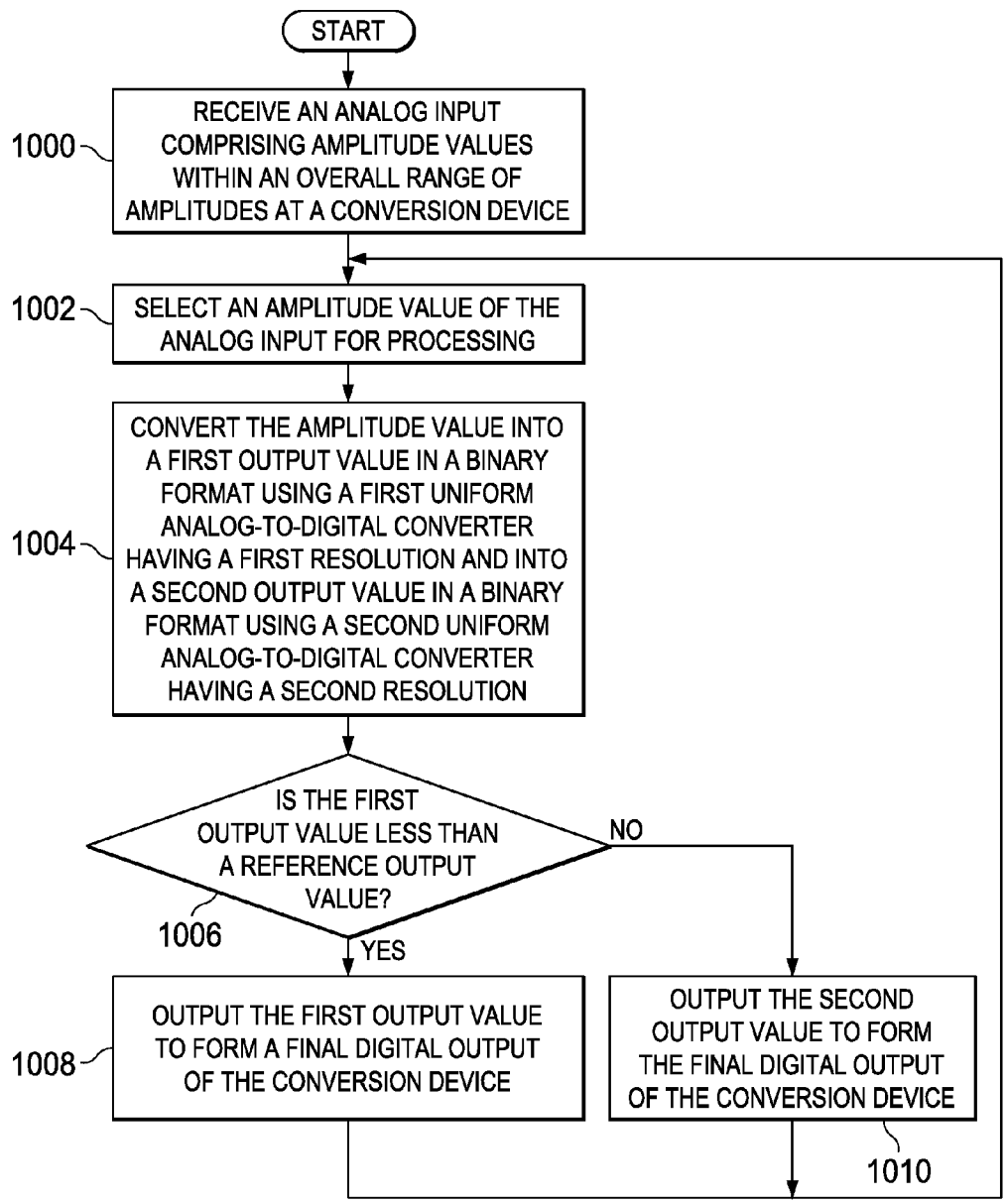
FIG. 10 is an illustration of a process for converting an analog input into a final digital output in the form of a flowchart in accordance with an illustrative embodiment.

With reference now to FIG. 10, an illustration of a process for converting an analog input into a final digital output is depicted in the form of a flowchart in accordance with an illustrative embodiment. The process illustrated in FIG. 10 may be implemented using, for example, without limitation, conversion device 100 in FIG. 1.

The process begins by receiving an analog input comprising amplitude values within an overall range of amplitudes at a conversion device (operation 1000). An amplitude value of the analog input is selected for processing (operation 1002). The amplitude value is converted into a first output value in a binary format using a first uniform analog-to-digital converter having a first resolution and into a second output value in a binary format using a second uniform analog-to-digital converter having a second resolution (operation 1004).

A determination is made as to whether the first output value is less than a reference output value (operation 1006). If the first output value is less than the reference output value, the first output value is output to form a final digital output of the conversion device (operation 1008), with the process then returning to operation 1002 described above. With reference again to operation 1006, if the first output value is not less than the reference output value, the second output value is output to form the final digital output of the conversion device (operation 1010), with the process then returning to operation 1002 described above.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, a portion of an operation or step, some combination thereof.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
  a first converter that produces a first digital output in response to receiving an analog input;
  a second converter that produces a second digital output in response to receiving the analog input; and
  a comparator that performs a comparison of a first output value in the first digital output generated by the first converter to a reference output value;
    wherein the first digital output is output to form a final digital output when an amplitude of the analog input is within a first portion of an overall range of amplitudes for the analog input and wherein the second digital output is output to form the final digital output when the amplitude is within a second portion of the overall range of amplitudes based on the comparison.

2. The apparatus of claim 1, wherein the first converter has a first resolution corresponding to the first portion of the overall range of amplitudes for the analog input.

3. The apparatus of claim 2, wherein the second converter has a second resolution corresponding to the second portion of the overall range of amplitudes for the analog input and wherein the first resolution and the second resolution are different.

4. The apparatus of claim 1 further comprising:
  a designator that determines when the analog input is sent to the first converter and when the analog input is sent to the second converter based on the amplitude of the analog input.

5. The apparatus of claim 1 further comprising:
  a designator that determines when the first digital output or the second digital output is used to form the final digital output of a conversion device formed by the first converter and the second converter.

6. The apparatus of claim 5, wherein the designator comprises:
  the comparator that performs the comparison of the first output value in the first digital output generated by the first converter to the reference output value and that outputs one of the first output value and a second output value in the second digital output generated by the second converter to form the final digital output based on the comparison.

7. The apparatus of claim 1, wherein the first converter is a first uniform analog-to-digital converter and the second converter is a second uniform analog-to-digital converter.

8. The apparatus of claim 1, wherein both the first converter and the second converter are N-bit uniform analog-to-digital converters.

9. A conversion device comprising:
  a first converter that has a first resolution and that produces a first digital output in response to receiving an analog input;
  a second converter that has a second resolution and that produces a second digital output in response to receiving the analog input;
  a designator that designates the first digital output to be output from the conversion device to form a final digital output when an amplitude of the analog input is within a first portion of an overall range of amplitudes for the analog input and that designates the second digital output to be output from the conversion device to form the final digital output when the amplitude is within a second portion of the overall range of amplitudes; and
  a third converter that has a third resolution and that produces a third digital output in response to receiving the analog input.

10. The conversion device of claim 9, wherein the designator designates the third digital output to be output from the conversion device to form the final digital output when the amplitude is within a third portion of the overall range of amplitudes.

11. A method for converting an analog input into a final digital output, the method comprising:
  generating a first digital output in response to receiving the analog input at a first converter;
  generating a second digital output in response to receiving the analog input at a second converter;
  performing a comparison of a first output value in the first digital output generated by the first converter to a reference output value; and
  outputting the first digital output to form the final digital output when an amplitude of the analog input is within a first portion of an overall range of amplitudes for the analog input and the second digital output to form the final digital output when the amplitude is within a second portion of the overall range of amplitudes based on the comparison.

12. The method of claim 11 further comprising:
receiving the analog input at the first converter when the amplitude of the analog input is within the first portion of the overall range of amplitudes, wherein the first converter has a first resolution.

13. The method of claim 12 further comprising:
receiving the analog input at the second converter when the amplitude of the analog input is within the second portion of the overall range of amplitudes, wherein the second converter has a second resolution.

14. The method of claim 13 further comprising:
designating, by a designator, the first converter to receive the analog input when the amplitude of the analog input is within the first portion of the overall range of amplitudes; and
designating, by the designator, the second converter to receive the analog input when the amplitude of the analog input is within the second portion of the overall range of amplitudes.

15. The method of claim 11 further comprising:
designating, by a designator, the first digital output to form the final digital output when the amplitude of the analog input is within the first portion of the overall range of amplitudes; and
designating, by the designator, the second digital output to form the final digital output when the amplitude of the analog input is within the second portion of the overall range of amplitudes.

16. The method of claim 11 further comprising:
outputting one of the first output value and a second output value in the second digital output generated by the second converter to form the final digital output based on the comparison.

17. The method of claim 16, wherein outputting one of the first output value and the second output value comprises:
outputting the first output value when the first output value is less than the reference output value; and
outputting the second output value when the first output value is not less than the reference output value.

18. The method of claim 11 further comprising:
generating a third digital output in response to receiving the analog input at a third converter, wherein the third digital output is output when the amplitude of the analog input is within a third portion of the overall range of amplitudes for the analog input.

19. The conversion device of claim 9, further comprising:
a comparator that performs a comparison of a first output value in the first digital output generated by the first converter to a reference output value;
wherein the designator designates the first digital output to be output from the conversion device based on the comparison.

20. A method for converting an analog input into a final digital output, the method comprising:
generating a first digital output in response to receiving the analog input at a first converter;
generating a second digital output in response to receiving the analog input at a second converter;
generating a third digital output in response to receiving the analog input at a third converter; and
outputting the first digital output to form the final digital output when an amplitude of the analog input is within a first portion of an overall range of amplitudes for the analog input, the second digital output to form the final digital output when the amplitude is within a second portion of the overall range of amplitudes, and the third digital output to form the final digital output when the amplitude is within a third portion of the overall range of the amplitudes.

* * * * *